United States Patent [19]

Sewell

[11] Patent Number: 5,218,517
[45] Date of Patent: Jun. 8, 1993

[54] TRANSLATING WEDGE HEAT SINK
[75] Inventor: Mark W. Sewell, Dahlgren, Va.
[73] Assignee: The United States of America as represented by the Secretary of the Navy, Washington, D.C.
[21] Appl. No.: 884,976
[22] Filed: May 18, 1992
[51] Int. Cl.$^5$ .............................................. H05K 7/20
[52] U.S. Cl. ................................. 361/388; 174/16.3; 257/719
[58] Field of Search ............ 254/104; 403/374, 409.1; 24/524-526; 357/81; 165/80.3, 185; 174/16.3; 439/485; 361/380, 382-389, 390, 417; 257/706, 707, 712, 713, 718, 719

[56] References Cited

U.S. PATENT DOCUMENTS

| | | | |
|---|---|---|---|
| 4,053,255 | 10/1977 | Taylor | 415/127 |
| 4,547,833 | 10/1985 | Sharp | 361/386 |
| 4,695,924 | 9/1987 | Wozniczka | 361/386 |
| 4,724,514 | 2/1988 | Kaufman | 361/388 |
| 4,751,963 | 6/1988 | Bui | 165/80.2 |
| 4,819,713 | 4/1989 | Weisman | 174/16.3 |
| 4,858,068 | 8/1989 | Bitller | 361/380 |
| 4,953,059 | 8/1990 | McNulty | 361/386 |
| 4,962,445 | 10/1990 | Pelet | 361/386 |
| 4,971,570 | 11/1990 | Tolle | 439/327 |
| 5,060,115 | 10/1991 | Sewell | 361/388 |

Primary Examiner—Gerald P. Tolin
Attorney, Agent, or Firm—John D. Lewis; Jacob Shuster

[57] ABSTRACT

A device for dissipating heat from cased electronics where optimum heat transfer is required, and where easy removability is desired. The device finds utility in sonobuoys, buoys, missiles and mines, as well as cabling electronics such as transoceanic communications equipment. The device contains a translating wedge which is drawn into a forced fit between the heat generating module and a conducting wedge which contacts the electronics case, resulting in a high efficiency conducting thermal path from the electronics to the equipment case. The device is particularly efficate in circular cased electronics.

4 Claims, 2 Drawing Sheets

TRANSLATING WEDGE HEAT SINK

The invention described herein may be manufactured and used by or for the Government of the United States of America for governmental purposes without the payment of any royalties thereon or therefor.

BACKGROUND OF THE INVENTION

The present invention relates generally to heat transfer devices and particularly to heat sinks for electronic modules. The invention herein is most specifically oriented towards electronics packaged cylindrically, such as is used in sonobuoys, torpedoes, mines and missiles, although the concept works equally well in boxed electronics.

Increasingly, electronics are packaged in cylindrical containers, particularly in the maritime and aerospace arts. The prior art is replete with devices and methods to shunt heat away from electronics components. These devices are oriented towards conventionally cased electronics and are generally not adaptable to cylindrically encased electronics.

Applicant has invented one heat sink for cylindrically encased electronics involving a circular wedge for circular electronic modules, as shown in U.S. Pat. No. 5,060,115 issued Oct. 22, 1991 in the name of Mark W. Sewell. This prior art device is limited to circular modules and lacks the ability to sink standard rectangular modules to an electronics case. This heat sink also lacks the ability of maintaining thermal conducting contact over a significant longitudinal area of a circular electronics case. In addition, this prior art device is restricted to cylindrically encased electronics while the instant invention is adaptable to cases of varied geometry.

Other related prior art includes U.S. Pat. No. 4,971,570 to Tolle et al. issued Nov. 20, 1990 which teaches a wedge clamp thermal connector for clamping either end of an electronic module having a heat conducting substrate. This device is designed to dissipate heat to the ambient air or to a cold plate.

U.S. Pat. No. 4,819,713 to Weisman issued Apr. 11, 1989 discloses a retainer for electronics modules wherein the retainer is a cold plate heat sink with the modules clamped in conducting engagement.

Many other prior art heat dissipating structures have been devised that dissipate heat from components to the environment such as is shown in U.S. Pat. No. 4,695,924 to Wozniezka, issued Sep. 22, 1987. Therein a finned sleeve surrounds a heat generating component and transfers heat which is radiantly dissipated in the environment.

U.S. Pat. No. 4,724,514 to Kaufman issued Feb. 21, 1989 teaches a device to transfer heat from the heat generating side of an electronics module to the opposing side which operates as sink to radiantly dissipate heat to the ambient air. Other prior art teachings reveal heat transfer schemes that transfer heat to the electronic housings or have heat dissipation tubes that function as a mounting rack for electronics or electronic modules. An example of this latter configuration is U.S. Pat. No. 4,656,559 issued Apr. 7, 1987 to Fathi.

These prior art devices are designed for conventionally packaged electronics and are not adaptable to high density cylindrically packaged electronic units that lack the internal air quantity and flow for internal cooling. Examples of cylindrical electronics are ubiquitous and include missiles, mines, torpedoes and sonobuoys. Cooling these devices has increasingly become more challenging as power requirements and miniaturization have increased. An effective heat transfer device is particularly needed in buoy and sonobuoy construction, as recent power requirements have escalated. There is a particular need for a heat transfer device that is efficate in sinking a standard rectangular electronics module in an efficient manner to cylindrical electronic cases.

SUMMARY OF THE INVENTION

The present invention is specifically directed to overcoming the above-enumerated problems in a novel and simple manner.

It is an object of the present invention to teach a heat sink device that can transfer heat directly to the inside wall of a cylindrical electronic housing.

It is a further object to teach a heat sink device for cylindrical electronics that may be easily installed and replaced.

It is still another object of the present invention to teach a heat sink device that optimizes thermal conduction paths with cylindrical electronic housings.

It is a further object to teach a heat sink device that is efficate for sinking rectangular electronic modules to a cylindrical electronics case.

It is yet another object to teach a heat sink device that is efficient in sinking a rectangular electronics module to a cylindrical case evenly along the longitudinal axis of the module.

It is another object to teach a heat sink that is efficient in dissipating 150 watts or more from a module of approximately 20 square inches of surface area in a tightly confined case.

It is still another object to teach a heat sink device that is in wedged relationship with both the electronic heat generating module and the electronic case thus increasing conductivity.

These and other objects are met by the present invention wherein rectangular electronic modules are sinked against an electronics case by sandwiching the electronic module between two heat sinking elements and then wedging the sandwiched module against the case and a conducting element also wedged against the case. This results in an enlarged square surface area of contact between the module and the heat sinking elements as well as increased surface area between the heat sinking elements and the electronics case. In circular cased electronics the heat dissipates radially as well as laterally from the module to the case. In addition, the wedged fit of the elements ensure a pressed engagement to the case increasing conductivity.

The appended claims set forth the novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which

DETAILED DESCRIPTION OF THE INVENTION

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only, and not as a limitation. The actual scope of the invention is intended to be defined in the following claims when viewed in their proper perspective based on the prior art.

Figure 1:
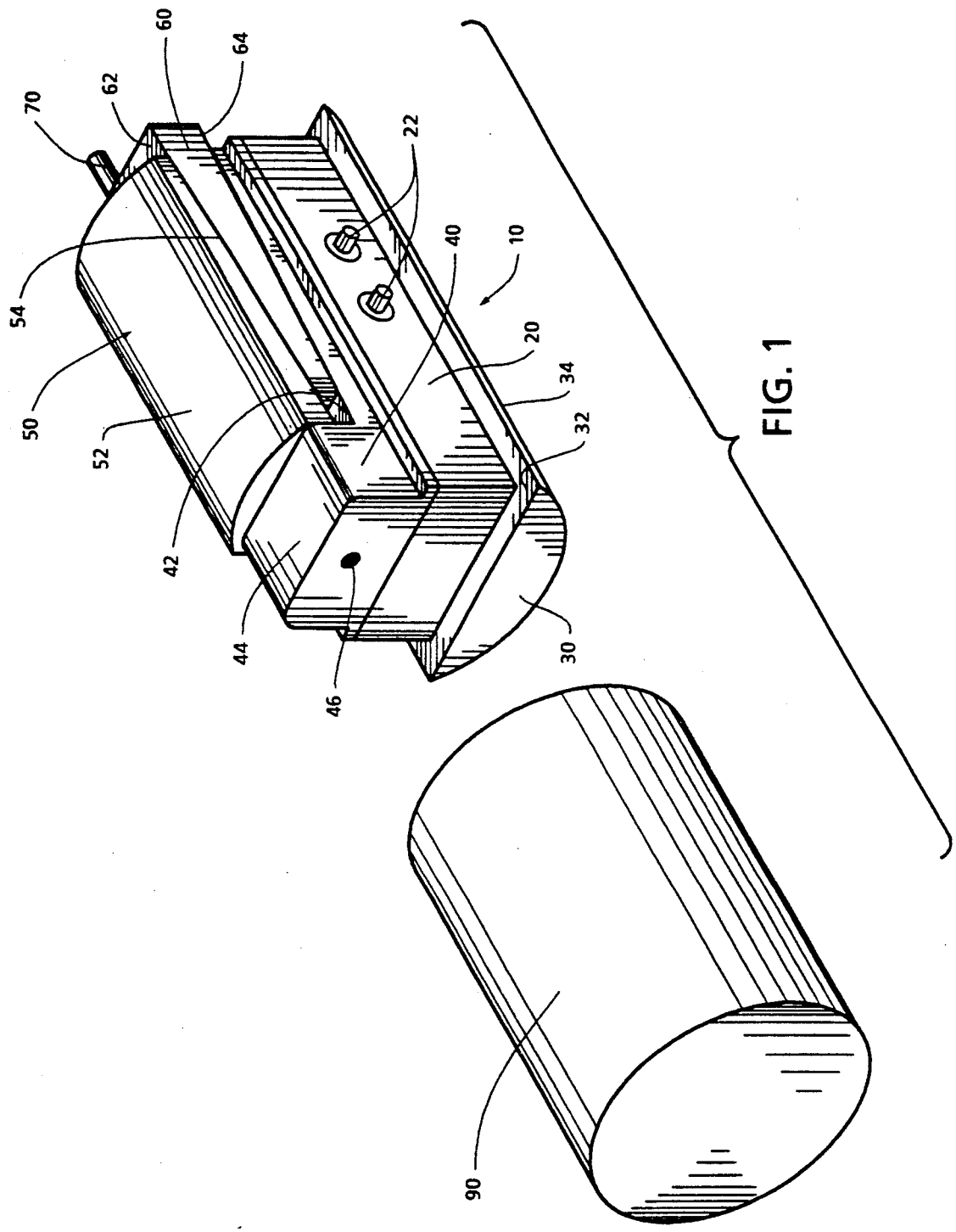
FIG. 1 is an illustration of Applicant's invention employing a dual inclined plane relationship between the elements.

Turning now to FIG. 1, the numeral 10 designates generally Applicant's heat sink. The heat sink device will reside within a heat dissipating electronic case 90 when assembled for operation. The embodiment chosen for illustration in FIG. 1 is constructed for a cylindrically shaped electronics case which, in this instance, is an instrumentation buoy. The case may be any conducting material and may be of conventional geometry rather than cylindrical, in which case elements in Applicant's device are machined to conform to the geometry of the case. The device finds particular utility in cylindrical aluminum alloy cases, however, as this device allows enhanced thermal sinking for a rectangular module to a cylindrical case. Most cylindrically encased electronics are buoys, sonobuoys, mines, torpedoes or bombs and missiles, which, due to weight restrictions, are fabricated from aluminum alloy.

The device sinks an electronics module 20, which generally will be rectangular in shape and high power. A main advantage of Applicant's device is the ability to sink more thermal energy than previously possible. In the embodiment built and tested, Applicant's device dissipated well in excess of 150 watts from a module measuring less than 2" by 5" and having a surface area less than 20 square inches. This sinking was to an aluminum alloy case submerged in 70° salt water with the module temperature never exceeding 100° F.

This efficient thermal sinking is accomplished by mounting the electronics module 20 on a conducting mount 30 which is machined flat on the mounting surface 32 to mount module 20. Conducting mount 30 is also machined to correspond with the geometry of electronics case 90 which in the embodiment chosen for illustration in FIG. 1 is cylindrical. In this instance, surface 34 is machined to have a convex shape which flush mounts against the inside surface of case 90 when device 10 is assembled. If the device were to be used in an electronic unit having a square or rectangular case, surface 34 would be planar. A conducting receiver 40 is mounted on the side of the electronics module 20 opposite that of the conducting mount whereby module 20 is sandwiched between the conducting mount and the conducting receiver. The conducting mount and receiver are fabricated of conducting material, in this case aluminum, thus sinking the module over a large percentage of its surface area. This encompassing of the module in thick electrically conducting material has the obvious advantage of providing a radio frequency (RF) shielding should it be desired that RF energy be kept in or out. It will also be obvious to those skilled in the art that module 20 could be several modules sandwiched in a laminated manner rather than a single board. In the illustration of FIG. 1, the leads and wiring 22, exit the sides of module 20, and because module 20 is not as wide as conducting mount 30, the leads may be freely run between the module 20 and case 90 when device 10 is assembled and installed.

It is important to note that receiver 40 has an inclined surface 42 and a raised shoulder 44 having a threaded hole 46 extending through shoulder 44. A second conducting mount 50 having a surface 52 machined to provide flush correspondence with the inside surface of case 90, and having an inclined surface 54, is assembled so that the inclined surface 54 and the inclined surface 42 of receiver 40 define a wedge shaped opening for receiving the translating conducting wedge 60. Wedge 60 has surfaces 62 and 64 machined to the same degree of inclination as surfaces 54 and 42. A torquing bolt 70 runs through the center of wedge 60 longitudinally and screws into threaded hole 46 of shoulder 44. Torquing bolt 70 may be a screw, bolt or allen head. An allen head was used in the example built and tested as illustrated in FIG. 1. As the torquing bolt is screwed into shoulder 44, wedge 60 is drawn toward shoulder 44 thus expanding the conductive mounts 30 and 50 against the inside surface of case 90. This provides module 20 with a sinking path radially to case 90 through conducting mounts 30 and 50 thus providing optimum heat dissipation. Applicants found that applying a thermally conducting grease, such as Thermal compound, Part No. 120-2 which is commercially available from Wakefield Engineering, Inc., Wakefield, Mass., enhanced the heat transfer between the elements. The forced fit of Applicant's device when drawn into contact with the case provides excellent heat transfer between the conducting elements.

Figure 2:
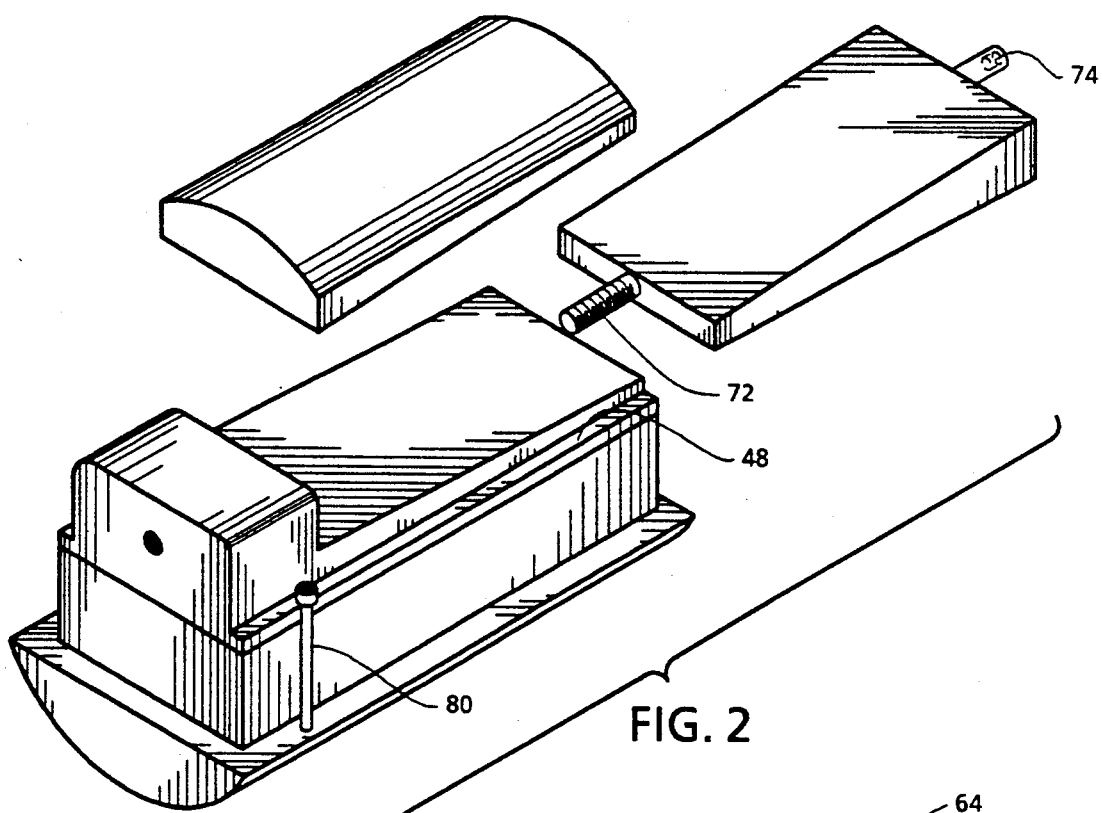
FIG. 2 is an exploded isometric view of the heat sinking device of FIG. 1.

Turning now to FIG. 2, an expanded parts view of Applicant's invention is provided for ease of understanding. As shown in FIG. 2, the electronics module 20 is fixedly attached to the receiver 40 and mount 30. The attachment means is considered a design choice and may be by screws 80 through a mounting lip 48 which extend through module 20 into mount 30 thus constituting a single element comprised of mount 30, module 20, and receiver 40 when ready for installation. These elements could also be attached, one to the other, by a conducting adhesive. FIG. 2 also illustrates more clearly torquing bolt 70 which therein has a threaded end 72 and an allen head 74.

Figure 3:
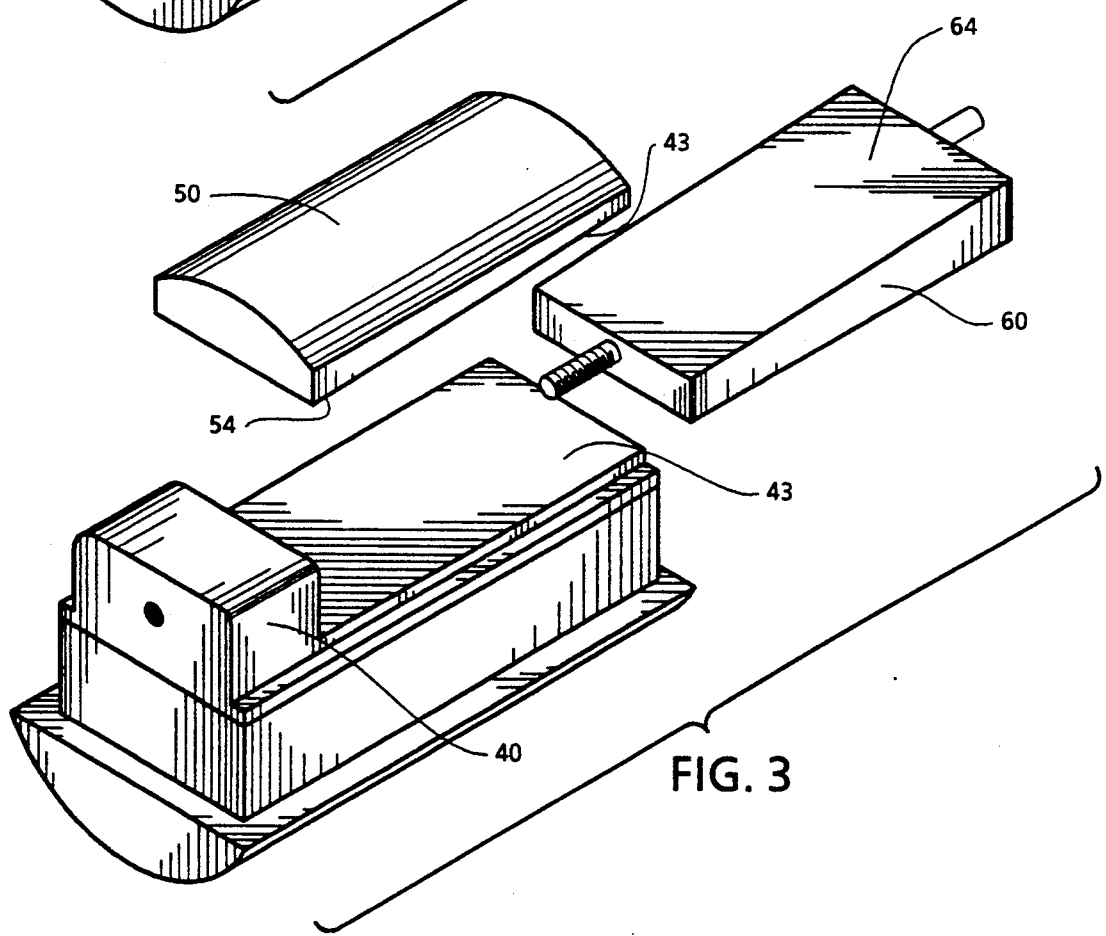
FIG. 3 is a species of Applicant's invention having a single inclined plane.

Turning now to FIG. 3, a slightly different embodiment of Applicant's invention is illustrated wherein receiver 40 has a side 43 which is not inclined, but is planar. Conducting mount 50 provides the only inclined surface 54 cooperating with translating wedge 60. In this embodiment one loses a degree o mechanical efficiency while gaining ease of manufacture. It is obvious that in the embodiment of FIG. 3, surface 64 of wedge 60 will be planar to correspond with planar surface 43 of receiver 40.

What is claimed is:

1. A translating wedge heat sink assembly for a heat generating electronics module comprising:
   a first conducting mount having a first mounting surface and a second conducting surface, said first mounting surface in thermal engagement with a first planar side of the heat generating electronics module, and said second conducting surface providing a continuuum of surface area between at least two opposing edges of said first mounting surface and further being defined by a first geometry of shape;

a conducting receiver having a first and second planar side with said first planar side in thermal engagement with a second planar side of the heat generating electronics module, said conducting receiver further having a raised shoulder on one end of said second planar side;

a second conducting mount having a first inclined plane wedge receiving surface and a second conducting surface, said second conducting surface of said second conducting mount providing a continuum of surface area between at least two opposing edges of said wedge receiving surface and further being defined by a second geometry of shape;

a translating wedge for drawn engagement between said second planar side of said conducting receiver and said wedge receiving surface of said second conducting mount;

a threaded torquing bolt rotatably mounted in said wedge and extending therefrom for threaded engagement with said raised shoulder; and a heat dissipating case surrounding said first conducting mount, the heat generating electronics module, said conducting receiver, said second conducting mount and said wedge, said heat dissipating case having first and second portions, said first portion internally shaped and sized to mate with said first geometry of shape and said second portion internally shaped and sized to mate with said second geometry of shape, wherein said conducting receiver, the heat generating electronics module and said first conducting mount are moved in a first direction and said second conducting mount is move din a substantially opposing direction to said first direction when said wedge is drawn into forced engagement between said conducting receiver and said second conducting mount by said torquing bolt's engagement with said raised shoulder on said conducting receiver, whereby said second conducting surfaces of said first and second conducting mounts are pressed into thermal engagement with said first and second portions of said heat dissipating case.

2. A translating wedge heat sink assembly according to claim 1 wherein said heat dissipating case is cylindrical and wherein said first and second geometries of shape are convex curves machined for engaging said first and second portions of sad cylindrical heat dissipating case.

3. A translating wedge heat sink assembly according to claim 1 wherein said first conducting mount, said second conducting mount, said conducting receiver and said translating wedge are fabricated of aluminum alloy.

4. A translating wedge heat sink assembly according to claim 1 wherein said second planar side of said conducting receiver is an inclined plane cooperating with said wedge.

* * * * *